(12) United States Patent
Kim et al.

(10) Patent No.: US 12,326,751 B2
(45) Date of Patent: *Jun. 10, 2025

(54) DRIFT DETECTION IN TIMING SIGNAL FORWARDED FROM MEMORY CONTROLLER TO MEMORY DEVICE

(71) Applicant: Rambus Inc., San Jose, CA (US)

(72) Inventors: Jun Kim, Los Altos Hills, CA (US); Pak Shing Chau, Saratoga, CA (US); Wayne S. Richardson, Saratoga, CA (US)

(73) Assignee: Rambus Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/635,817

(22) Filed: Apr. 15, 2024

(65) Prior Publication Data

US 2024/0361799 A1   Oct. 31, 2024

Related U.S. Application Data

(63) Continuation of application No. 18/206,867, filed on Jun. 7, 2023, now Pat. No. 11,983,031, which is a
(Continued)

(51) Int. Cl.
*G06F 1/08* (2006.01)
*G06F 1/10* (2006.01)
(Continued)

(52) U.S. Cl.
CPC ............... *G06F 1/08* (2013.01); *G06F 1/10* (2013.01); *G06F 13/1673* (2013.01); *G06F 13/1689* (2013.01); *H03L 7/07* (2013.01); *H03L 7/0814* (2013.01); *H03L 7/0995* (2013.01); *H04L 7/0008* (2013.01); *H04L 7/0033* (2013.01); *H04L 7/10* (2013.01); *Y02D 10/00* (2018.01)

(58) Field of Classification Search
CPC .......... G06F 1/08; G06F 1/10; G06F 13/1673; G06F 13/1689; H03L 7/07; H03L 7/0814; H03L 7/0995; H04L 7/0008; H04L 7/0033; H04L 7/10; Y02D 10/00
See application file for complete search history.

(56) References Cited

U.S. PATENT DOCUMENTS

| 5,087,829 A | 2/1992 | Ishibashi et al. |
| 6,643,787 B1 | 11/2003 | Zerbe et al. |

(Continued)

FOREIGN PATENT DOCUMENTS

| WO | WO-WO 2012-082274 | 6/2012 |

*Primary Examiner* — Zhipeng Wang
(74) *Attorney, Agent, or Firm* — Fenwick & West LLP

(57) ABSTRACT

A memory system in which a timing drift that would occur in distribution of a first timing signal for data transport in a memory device is determined by measuring the actual phase delays occurring in a second timing signal that has a frequency lower than that of the first timing signal and is distributed in one or more circuits mimicking the drift characteristics of at least a portion of distribution of the first timing signal. The actual phase delays are determined in the memory device and provided to a memory controller so that the phases of the timing signals used for data transport may be adjusted based on the determined timing drift.

20 Claims, 5 Drawing Sheets

Related U.S. Application Data continuation of application No. 17/830,163, filed on Jun. 1, 2022, now Pat. No. 11,709,525, which is a continuation of application No. 17/102,119, filed on Nov. 23, 2020, now Pat. No. 11,378,998, which is a continuation of application No. 16/566,287, filed on Sep. 10, 2019, now Pat. No. 10,877,511, which is a continuation of application No. 15/391,299, filed on Dec. 27, 2016, now Pat. No. 10,496,126, which is a continuation of application No. 14/961,077, filed on Dec. 7, 2015, now Pat. No. 9,568,942, which is a continuation of application No. 13/656,498, filed on Oct. 19, 2012, now Pat. No. 9,235,537.

(60) Provisional application No. 61/551,717, filed on Oct. 26, 2011.

(51) Int. Cl.
*G06F 13/16* (2006.01)
*H03L 7/07* (2006.01)
*H03L 7/081* (2006.01)
*H03L 7/099* (2006.01)
*H04L 7/00* (2006.01)
*H04L 7/10* (2006.01)

(56) References Cited

U.S. PATENT DOCUMENTS

| | | | |
|---|---|---|---|
| 6,675,272 B2 | 1/2004 | Ware et al. | |
| 6,839,393 B1 | 1/2005 | Sidiropoulos | |
| 6,961,862 B2 | 11/2005 | Best et al. | |
| 7,400,671 B2 | 7/2008 | Hampel et al. | |
| 7,415,073 B2 | 8/2008 | Ware et al. | |
| 7,466,784 B2 | 12/2008 | Sidiropoulos | |
| 7,519,844 B2 | 4/2009 | Kizer et al. | |
| 7,571,340 B2 | 8/2009 | Jiang | |
| 7,668,276 B2 | 2/2010 | Hampel et al. | |
| 7,870,414 B2 | 1/2011 | Koo | |
| 7,948,812 B2 | 5/2011 | Ware | |
| 8,432,768 B2 | 4/2013 | Ware et al. | |
| 8,504,788 B2 | 8/2013 | Stott et al. | |
| 8,886,988 B2 * | 11/2014 | Lin | H04L 7/0037 713/401 |
| 9,330,034 B2 * | 5/2016 | Frans | G06F 13/1684 |
| 2005/0210308 A1 * | 9/2005 | Best | G06F 1/12 713/503 |
| 2005/0225330 A1 | 10/2005 | Ochiai et al. | |
| 2005/0280407 A1 * | 12/2005 | Loke | H03L 7/0816 327/158 |
| 2006/0233036 A1 | 10/2006 | Blodgett et al. | |
| 2007/0096785 A1 * | 5/2007 | Maeda | H03L 7/0805 327/158 |
| 2007/0286320 A1 * | 12/2007 | Jiang | H04L 7/0008 375/371 |
| 2009/0077409 A1 * | 3/2009 | Matulik | G06F 13/1689 713/401 |
| 2009/0238016 A1 * | 9/2009 | Matulik | G06F 13/1689 365/194 |
| 2010/0037111 A1 * | 2/2010 | Ziaja | G06F 11/24 714/744 |
| 2010/0271092 A1 | 10/2010 | Zerbe et al. | |
| 2010/0329045 A1 * | 12/2010 | Lee | G06F 13/4234 711/E12.005 |
| 2011/0055671 A1 | 3/2011 | Kim et al. | |
| 2011/0135030 A1 * | 6/2011 | Bae | H04L 7/10 375/295 |
| 2011/0235763 A1 | 9/2011 | Palmer et al. | |

* cited by examiner

DRIFT DETECTION IN TIMING SIGNAL FORWARDED FROM MEMORY CONTROLLER TO MEMORY DEVICE

CROSS-REFERENCE TO RELATED APPLICATIONS

This patent application is a continuation of U.S. patent application Ser. No. 18/206,867 filed on Jun. 7, 2023, which is a continuation of U.S. patent application Ser. No. 17/830,163 filed on Jun. 1, 2022 which is a continuation of U.S. patent application Ser. No. 17/102,119 filed on Nov. 23, 2020 which is a continuation of U.S. patent application Ser. No. 16/566,287 filed on Sep. 10, 2019 which is a continuation of U.S. patent application Ser. No. 15/391,299 filed on Dec. 27, 2016 which is a continuation of U.S. patent application Ser. No. 14/961,077, filed on Dec. 7, 2015 which is a continuation of U.S. patent application Ser. No. 13/656,498, filed on Oct. 19, 2012 which claims the benefit of U.S. Provisional Patent Application No. 61/551,717, filed on Oct. 26, 2011, each of which are incorporated by reference its entirety.

BACKGROUND

The present disclosure generally relates to memory systems and related components such as memory devices and controllers.

In a memory system, a timing reference (e.g., a clock signal) may experience timing drift (or phase drift) due to variations in temperature and voltage and other conditions under which a memory device of the memory system operates, such that a counterpart timing reference in the memory controller of the memory system and the timing reference in the memory device are not in phase.

BRIEF DESCRIPTION OF THE DRAWINGS

The teachings of the embodiments herein can be readily understood by considering the following detailed description in conjunction with the accompanying drawings.

DETAILED DESCRIPTION OF EMBODIMENTS

Embodiments include a memory system in which a timing drift that would occur in distribution of a first timing signal for data transport in a memory device is determined by measuring the actual phase delays occurring in a second timing signal that has a frequency lower than that of the first timing signal and is distributed in one or more circuits mimicking the drift characteristics of at least a portion of distribution of the first timing signal. The second timing signal is generated in a memory controller and forwarded to the memory device during power down or timing drift calibration events. The actual phase delay is determined in the memory device and provided to the memory controller so that the phases of the timing signals used for data transport may be adjusted based on the determined timing drift.

A ""timing signal" herein refers to any signal that is used to determine the timing at which data is to be sampled or transmitted, for example, for data read, write, or transport in a memory system or any communication interface between integrated circuits. For example, timing signal may be a clock signal or a strobe signal. The embodiments herein will be explained primarily in the context of a clock signal for simplicity of illustration, however the same principles of the embodiments described herein may be applied with strobe signals or other types of timing signals.

Reference will now be made to several embodiments of the present disclosure, examples of which are illustrated in the accompanying figures. It is noted that wherever practicable similar or like reference numbers may be used in the figures and may indicate similar or like functionality. The figures depict embodiments of the present disclosure for purposes of illustration only. One skilled in the art will readily recognize from the following description that alternative embodiments of the structures and methods illustrated herein may be employed without departing from the principles, or benefits touted, of the disclosure described herein.

Figure 1:
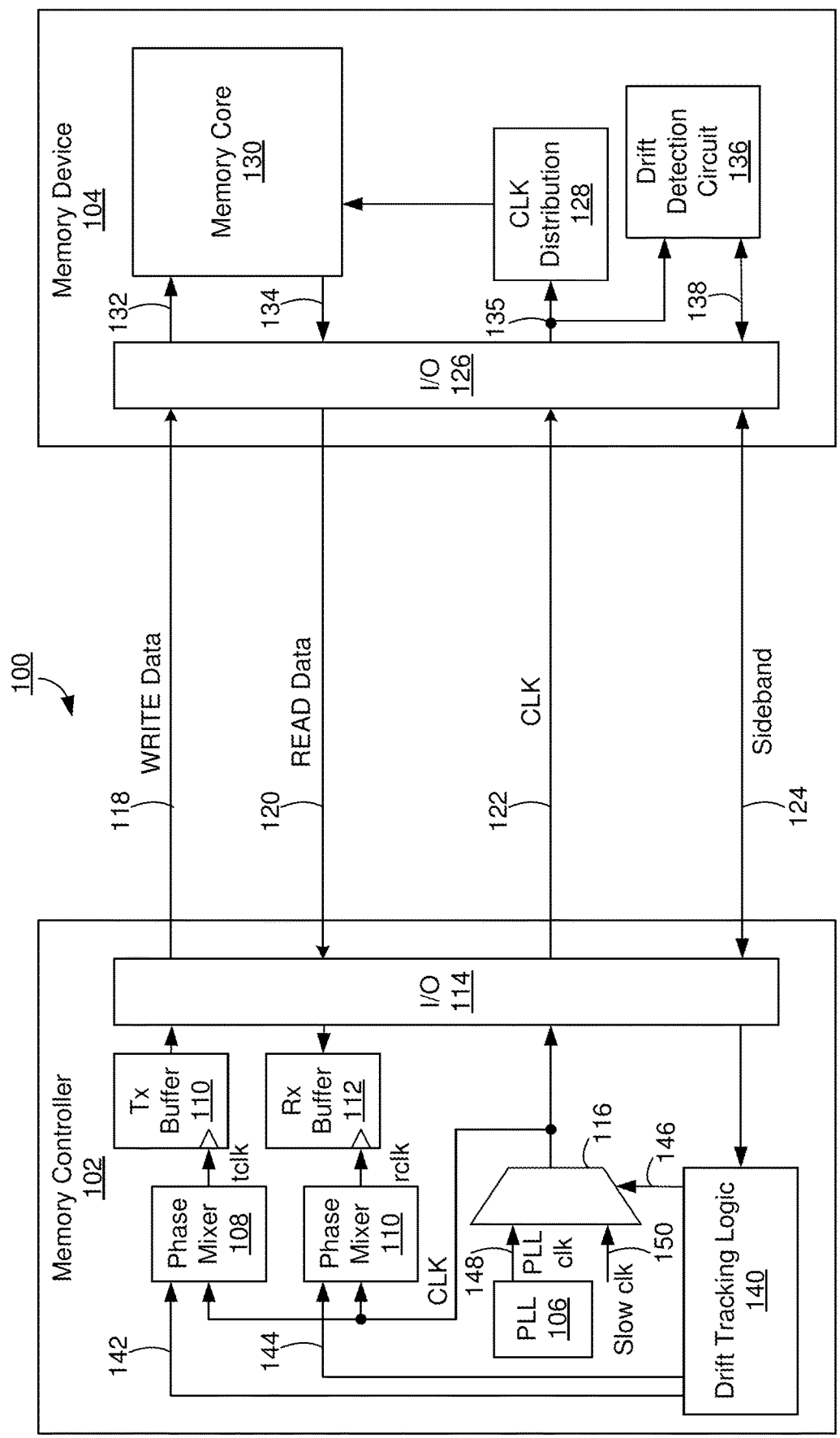
FIG. 1 illustrates a memory system with clock drift detection according to one embodiment.

FIG. 1 illustrates a memory system with clock drift detection according to one embodiment. In one embodiment, the memory system includes a memory controller integrated circuit ("IC") ("memory controller" or "controller" hereafter) coupled to one or more memory ICs ("memory components" or "memory devices" hereafter) through a signaling interface. For example, FIG. 1 presents a block diagram illustrating an embodiment of memory system 100, which includes a memory controller 102 coupled to a memory device 104 via signaling interfaces 118, 120, 122, 124. Memory device 104 may be a DRAM (dynamic random access memory), SRAM (standard random access memory), a non-volatile memory such as a flash memory, or any other type of memory device.

Memory controller 102 includes a phase locked loop (PLL) 106, a clock selection circuit 116, a Tx phase mixer 108 and a Rx phase mixer 110, a Tx buffer 110, a Rx buffer 112, drift tracking logic 140, and I/O interface 114. Memory device 140 includes memory core 130, clock distribution circuit 128, digital drift detection logic 136, and I/O interface 126. The memory controller 102 and memory device 104 communicate with data interconnects (DQ) including WRITE link 118, READ link 120, clock (CLK) link 122, and a sideband communication interface 124, and other links (such as command/address links) that are not shown herein for simplicity of illustration. While FIG. 1 illustrates memory system 100 having one memory controller 102 and one memory device 104, other embodiments may have additional memory controllers and/or more memory devices 104. In one embodiment, memory controller 102 and memory devices 104 may be implemented as separate dies within the same package. In other embodiments, they are implemented in their own respective packages. While WRITE link 118 and READ link 120 are shown as unidirectional links in FIG. 1, the WRITE link 118 and READ link 120 may be replaced with a single bi-directional link or bus that handles bidirectional data transport.

PLL 106 generates a clock signal (PLL clk) 148 to be used for data transport, i.e., transmitting WRITE data to the memory device 104 and receiving READ data from memory device 104 via data links 118, 120, respectively. The PLL clock signal 148 is a high frequency clock signal at the clock rate of data transport in the memory system. For example, the PLL clock signal 148 may have a 1.6 GHz frequency that operates with a 1.6 Gbit/s data rate (SDR or single data rate), a 1.6 GHz frequency that operates with a 3.2 Gbit/s data rate (DDR or double data rate), a 1.6 frequency that operates works with a 6.4 Gbit/s data rate (QDR or quad data rate), etc. In normal data transport operation of the memory system, clock selection circuit 116 selects the PLL clock signal 148 generated by PLL 106, which is then provided to TX phase mixer 108 and RX phase mixer 110. The phase of the PLL clock signal 148 is adjusted by TX phase mixer 108 and RX phase mixer 110 by phase adjustment control signals 142, 144, respectively, provided by drift tracking logic 140, so that the transmit clock (tclk) and receive clock (rclk) for use in normal data transport are generated with proper phase adjustments that account for phase drift that will be experienced by the memory clock signal 136 in memory device 104 due to temperature and voltage variations.

The PLL clock 148 is also provided to memory device 104 via CLK link 122 for use in memory device 104 during normal data transport (READ/WRITE). In some embodiments, the received memory clock signal 135 may be distributed by clock distribution circuit 128 to memory core 130 and other circuitry (not shown) within memory device 104 to sample data in and out of memory core 130 for normal data transport. The memory clock signal 135 will experience time drift while being distributed throughout the memory device 104 due to temperature and voltage variations and fall out of synchronization with the PLL clock 148 output from PLL 106. However, since tclk and rclk for data write or data read operations are generated with phases that are adjusted by phase mixers 108, 110 according to the time drift determined by drift detection circuit 136 with drift tracking logic 140, the tclk and rclk clock signals will be synchronized with the clock signals used by memory core 130 for data write or data read operations, respectively with the time drift.

When memory controller 102 conducts periodic timing calibration to determine drift in the clock signal provided to memory device 104 (for example, during a power down event), a separate clock signal (slow clk) is used. Slow clock signal 150 has a much lower frequency than the PLL clock 148. For example, slow clock signal 150 can have a frequency that is ½, ¼, ⅛, or other similar fraction of the frequency of PLL clock 148. For instance, slow clock signal 150 may have a frequency of 400 MHz while the PLL clock 148 has a frequency of 1.6 GHz. Thus, drift tracking logic 140 causes 146 clock selection circuit 116 to select the slow clock 150 rather than the PLL clock 148 to forward to memory device 104 over the clock signal link 122. On the memory device 104, slow clock signal 135 is received by drift detection circuit 136 for use in determining the timing drift in the clock signal in the memory core 130. Note that drift detection circuit 136 determines timing drift in memory device 104 not based on the actual PLL clock signal 148 used in normal transport but with slow clock signal 150 that has a frequency that is lower than that of the PLL clock 148.

As will be explained in more detail below, in one embodiment drift detection circuit 136 includes digital circuitry that mimics the delay characteristics of parts of or all of the clock distribution paths 128 of memory device 104, and is also configured to determine the drift introduced into the slow clock signal 150 when it enters the drift detection circuit 136. In one embodiment, drift detection circuit 136 is comprised of CMOS logic that consumes power only when the CMOS logic is operated, thereby obviating the need to turn off the drift detection circuit 136 separately when it is not used, for example, during normal data transport in memory system 100. In addition, drift detection circuit 136 may determine drift in the slow clock signal 150 more accurately, reflecting the actual drift that would be experienced by the PLL clock 148 if it were to be distributed in memory device 104, because drift detection circuit 136 is placed within the same memory device 104 where the actual clock distribution circuit 128 is placed.

Use of the slow clock signal 150, as opposed to the high frequency PLL clock 148, to determine clock drift in memory device 104 in various embodiments, has benefits that may be realized in power savings, simplicity, and/or functionality improvements. For example, PLL 106 need not be turned on during periodic timing calibration, thus saving power and allowing the memory controller 102 to enter power save operation modes during periodic timing calibration. Second, use of the low frequency in the slow clock 150 obviates the need to turn on complicated components in the I/O circuitry 126 designed to accommodate communication using high frequency clock signals. Furthermore, the low frequency in the slow clock 150 also allows use of digital circuitry in drift detection circuit 136 that has time drift characteristics substantially proportional to change in voltage/temperature, which facilitates determination of the amount of calibration needed for generating tclk and rclk.

Drift tracking logic 140 may have drift detection circuit 136 determine the amount of phase delay introduced to the slow clock signal 150 multiple times, each instance representing the clock drift mimicking a different (distinct) part of the clock distribution circuit 128, and receive such phase delay information of each of such instance from drift detection circuit 136 via sideband link 124. Drift tracking logic 140 determines the proper phase adjustment to be made to the CLK signal 148 for use as the transmit clock (tclk) and receive clock (rclk) during data transport, based on such information on clock drift received from drift detection circuit 136, as will be explained in more detail below. Drift tracking logic 140 may include a plurality of logic instructions or algorithms to initiate such drift detection by drift detection circuit 136 under a variety of conditions, receive the clock drift information from memory device 104, and apply the algorithms to determine the proper phase adjustments 142, 144 to be made to the transmit clock (tclk) and the receive clock (rclk) during data transport. The amount of phase adjustment 142 to tclk is determined based on the time drift information to optimize the capture of WRITE data at the memory device. Similarly, the amount of phase adjustment 144 to rclk is determined based on the time drift information to optimize the capture of READ data at the memory controller 102. In one embodiment, drift tracking logic 140 may be comprised of logic circuits or a microcontroller configured to perform such periodic timing calibrations as explained above.

Drift tracking logic 140 may perform initial measurement of the phase delay on the slow clock signal 150 as described above when the memory system 100 is powered up. Drift tracking logic 140 may also repeat such phase delay measurement on the slow clock signal 150 as described above periodically to obtain new phase delay information as the memory system 100 is in use and the voltage and temperature conditions under which the memory device 104 is used changes, for drift maintenance. During drift maintenance, drift tracking logic 140 would compare the newly obtained phase delay information with the previous phase delay information and adjust the phase adjustment settings 142, 144 to tolk and rclk, respectively, accordingly to maintain optimal clock phase for data transport as the voltage and temperature conditions change.

Note that a different drift tracking algorithm may be used in drift tracking logic 140 to adapt to different operating conditions (voltage or temperature) or memory devices 104 fabricated in different process lots. Drift tracking logic 140 may be implemented with hardware such as logic circuits or by software algorithms.

Figure 2:
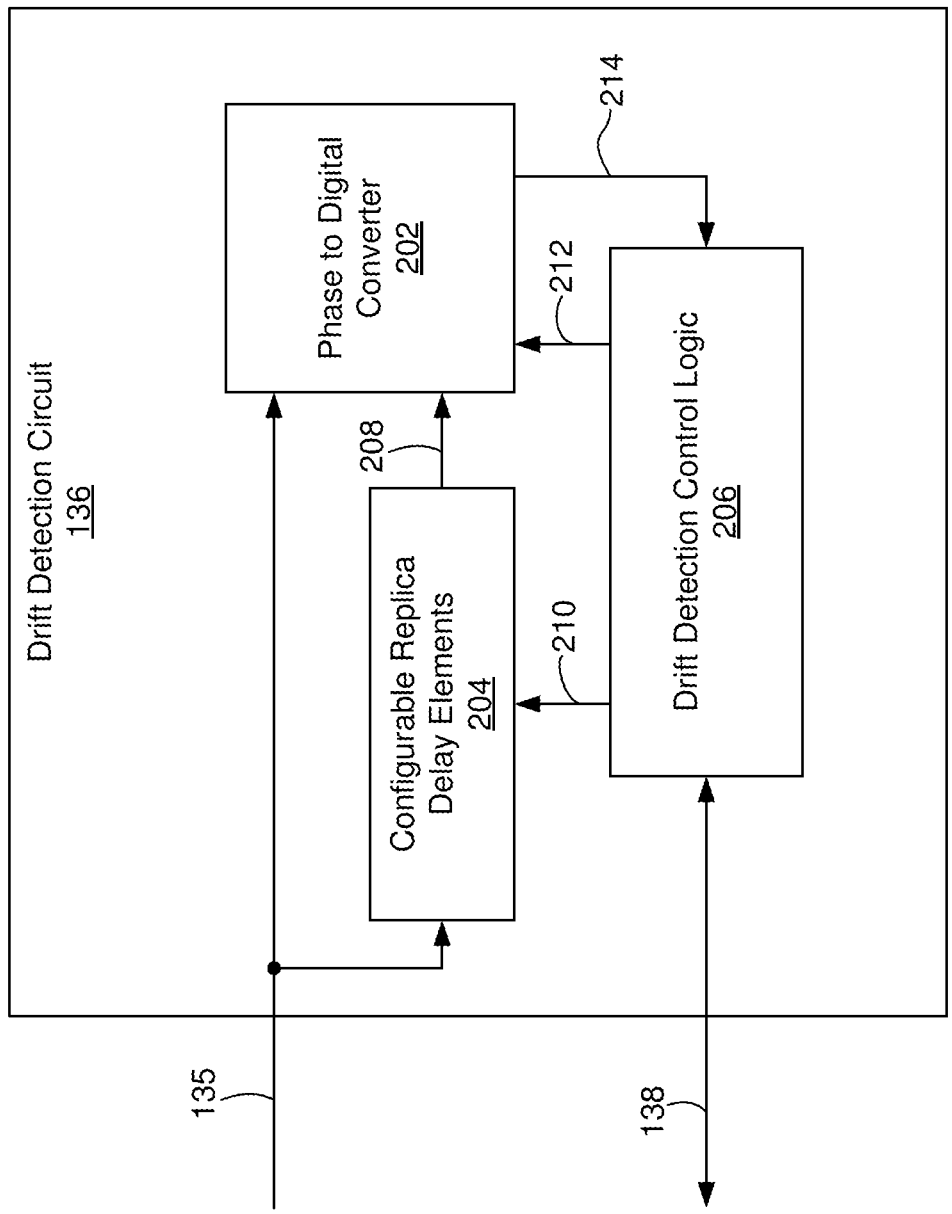
FIG. 2 illustrates a drift detection circuit used in a memory device, according to one embodiment.

FIG. 2 illustrates a drift detection circuit used in a memory device, according to one embodiment. In one embodiment, drift detection circuit 136 includes drift detection control logic 206, configurable delay elements 204, and a phase to digital converter 202. In one embodiment, the drift detection circuit 136 is comprised of CMOS logic that consumes power only when the CMOS logic is operated, thereby obviating the need to turn off the drift detection circuit 136 separately when it is not used (i.e., during normal data transport).

Figure 3:
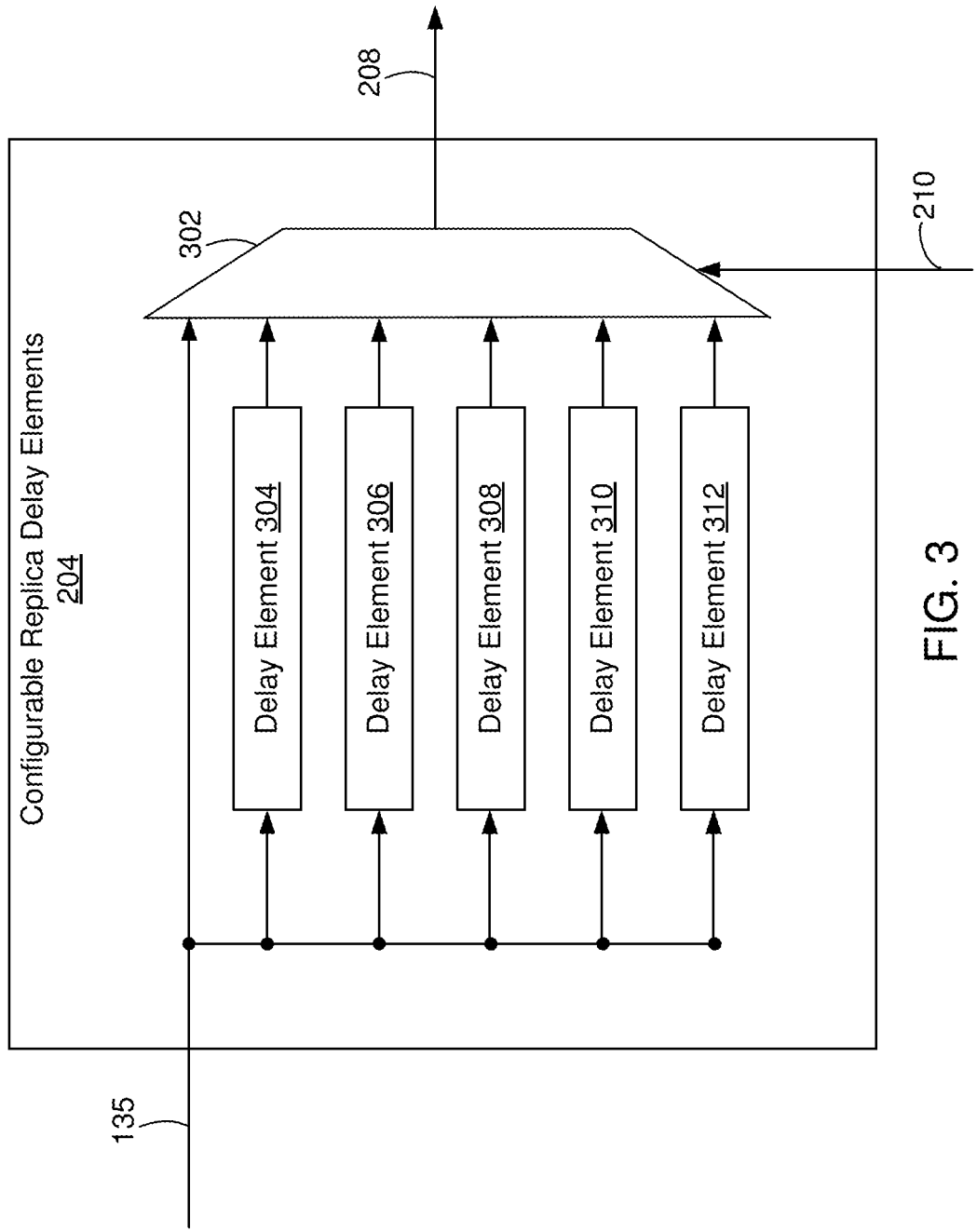
FIG. 3 illustrates a configurable replica delay element used in the drift detection circuit of FIG. 2, according to one embodiment.

Configurable replica delay elements 204 in one embodiment includes digital circuitry that mimics the drift characteristics of the clock distribution paths 128 of memory device 104. A more detailed illustration of one example of the configurable replica delay element 204 appears in FIG. 3. As shown in FIG. 3, configurable replica delay 204 includes a plurality of delay elements 304, 306, 308, 310, 312, all coupled to the inputs of a selection circuit 302. In one embodiment, each of the delay elements 304, 306, 308, 310, 312 is designed such that it mimics the drift characteristics of a different part of the clock distribution path 128 of the memory device 104, or the entire clock distribution path 128. Selection circuit 302 may be a multiplexer that selects the output of one of the delay elements 304, 306, 308, 310, 312 as its output 208, according to selection signal 210 from drift detection control logic 206. In one embodiment, the delay elements 304, 306, 308, 310, 312 are comprised of buffers or RC (resistor-capacitor) delay elements.

Referring back to FIG. 2 in conjunction with FIG. 3, drift detection control logic 206 receives instructions 138 from drift tracking logic 140 via sideband link 124 to determine the phase delay on the slow clock 150 received via CLK link 122 as contributed to by one or more of the delay elements 304, 306, 308, 310, 312. Thus, drift tracking logic 140 may provide instructions to the drift detection control logic 206 to select 210 a certain one or more of the delay elements 304, 306, 308, 310, 312 so that the phase delay on the slow clock 150 contributed to by the selected delay element can be tested and determined, which would also mimic or reflect the actual drift that would be contributed to the actual PLL clock 148 in normal data transport by the part of the clock distribution paths 128 mimicked by the selected delay element.

Phase to digital converter 202 receives the slow clock signal 150 received at link 135, and the delayed slow clock 208 output by the selected delay element 304, 306, 308, 310, 312, and determines the difference between the phases of the two clock signals 150 and 208 in the form of a digital value 214 that represents the difference in phase, under control 212 of the drift detection control logic 206. Drift detection control logic 206 sends back the determined digital value 214 back to drift tracking logic 140 via sideband 140. Drift tracking logic 140 may repeat such drift tests multiple times by selecting different delay elements 304, 306, 308, 310, 312 one at a time, and receiving the digital phase difference values 214 corresponding to the selected delay elements 304, 306, 308, 310, 312 multiple times. Drift tracking logic 140 is configured with algorithms or logic circuits to accomplish such phase drift tests one or more times using the selected delay elements, and combine such digital phase difference values 214 received from drift detection control logic 206 to determine the overall phase drift that would be introduced by the entire clock distribution circuit 128 on the PLL clock 148 to be received by memory device 104 in normal data transport. In doing so, drift tracking logic 140 keeps track of which delay element 304, 306, 308, 310, 312 is selected (reflecting which part of the clock distribution circuit 128 is tested indirectly by the selected delay element) as well as the corresponding digital phase difference value 214 received from detection control logic 206, and determines the overall phase drift on the PLL clock 148 that will be caused in memory device 104 using one or more of the digital phase difference values 214. Further, drift tracking logic 140 further applies the algorithms to determine the proper phase adjustment 142, 144 for the transmit clock (tclk) and receive clock (rclk) during data transport based on the determined overall phase drift on the PLL clock 148 that will be caused in memory device 104.

In one embodiment, drift detection control logic 206 and phase to digital converter 202 as well as the configurable replica delay elements 204 are comprised of digital circuits such as CMOS logic that consumes power only when the CMOS logic is operated, thereby obviating the need to turn off the drift detection circuit 136 separately when it is not used, for example, during normal data transport between the memory device 104 and memory controller 102. Such digital circuits may be beneficially used in the drift detection control logic because a slow clock signal 150 that is more compatible for use with a digital circuit is used to determine phase drift in the memory device 104.

Figure 4:
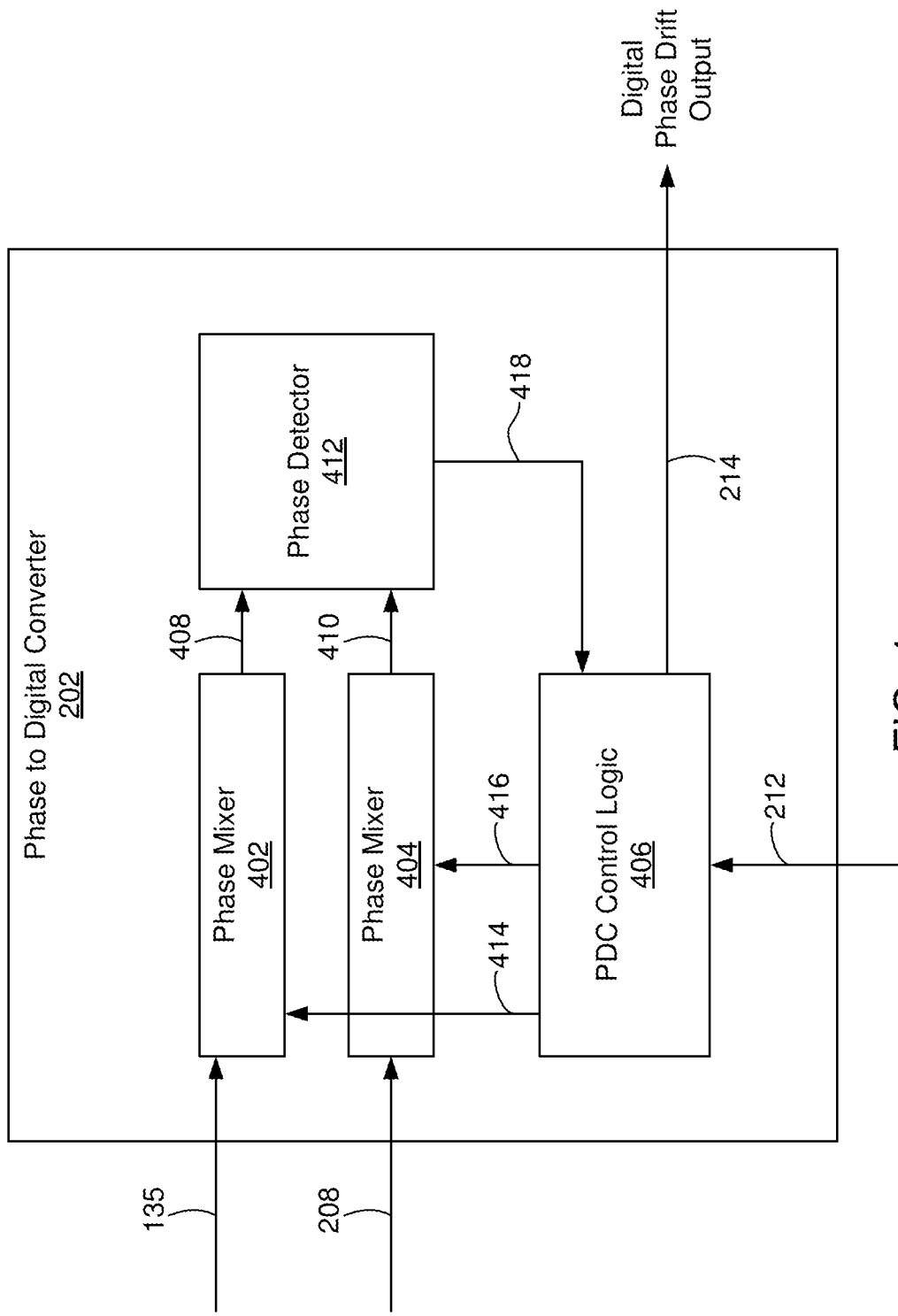
FIG. 4 illustrates a phase to digital converter used in the drift detection circuit of FIG. 2, according to one embodiment.

FIG. 4 illustrates a phase to digital converter used in the drift detection circuit of FIG. 2 in more detail, according to one embodiment. Phase to digital converter (PDC) 202 includes PDC control logic 406, digital phase mixers 402, 404, and a phase detector 412. Phase mixer 402 receives slow clock 150 on link 135 and phase mixer 404 receives the delayed slow clock 208 generated by delaying the slow clock 150 with the selected delay element 304, 306, 308, 310, 312. Phase mixer 402 adjusts the phase of the un-delayed, slow clock 150 under control of phase control signal 414 to generate a phase-adjusted slow clock 408, and phase mixer 404 adjusts the phase of the delayed slow clock 208 under control of phase control signal 416 to generate a phase-adjusted delayed slow clock 410. Phase detector 412 determines whether the phase-adjusted slow clock 408 and the phase-adjusted delayed slow clock 410 are substantially in phase, and provides an indication 418 to PDC control logic 406 that the phase-adjusted slow clock 408 and the phase-adjusted delayed slow clock 410 are in phase.

PDC control logic 406 keeps track of the phase control signals 414, 416 it used. When PDC control logic 406 receives the indication signal 418 that the phase-adjusted slow clock 408 and the phase-adjusted delayed slow clock 410 are in phase, it determines the differences in the phase adjustments 402, 404 it caused to slow clock signal 150 and delayed clock signal 208 to determine a digital value corresponding to the differences in the phase adjustments 402, 404. Because the phases of the slow clock signal 150 and delayed clock signal 208 that were originally out of phase are adjusted by phase mixers 402, 404 to be in phase according to the phase adjustment signals 414, 416, the difference in phase adjustment signals 414, 416 used when the phase-adjusted slow clock 408 and the phase-adjusted delayed slow clock 410 were made to be in phase would represent the phase difference between slow clock signal 150 on link 135 and delayed slow clock signal 208. Thus, the PDC control logic 406 can determine the difference in phase between these digital phase adjustment signals 414, 416 as a digital phase difference value 214, representing the phase difference between the slow clock signal 150 and delayed slow clock signal 208. Phase drift in the slow clock signal 150 can be eventually determined by comparing the digital phase difference value 214 with another digital phase difference value previously obtained. While FIG. 4 illustrates one embodiment of how the phase to digital converter 202 may be implemented, other ways of determining a phase difference between slow clock signal 150 and delayed slow clock signal 208 in the form of a digital value may be used.

Figure 5:
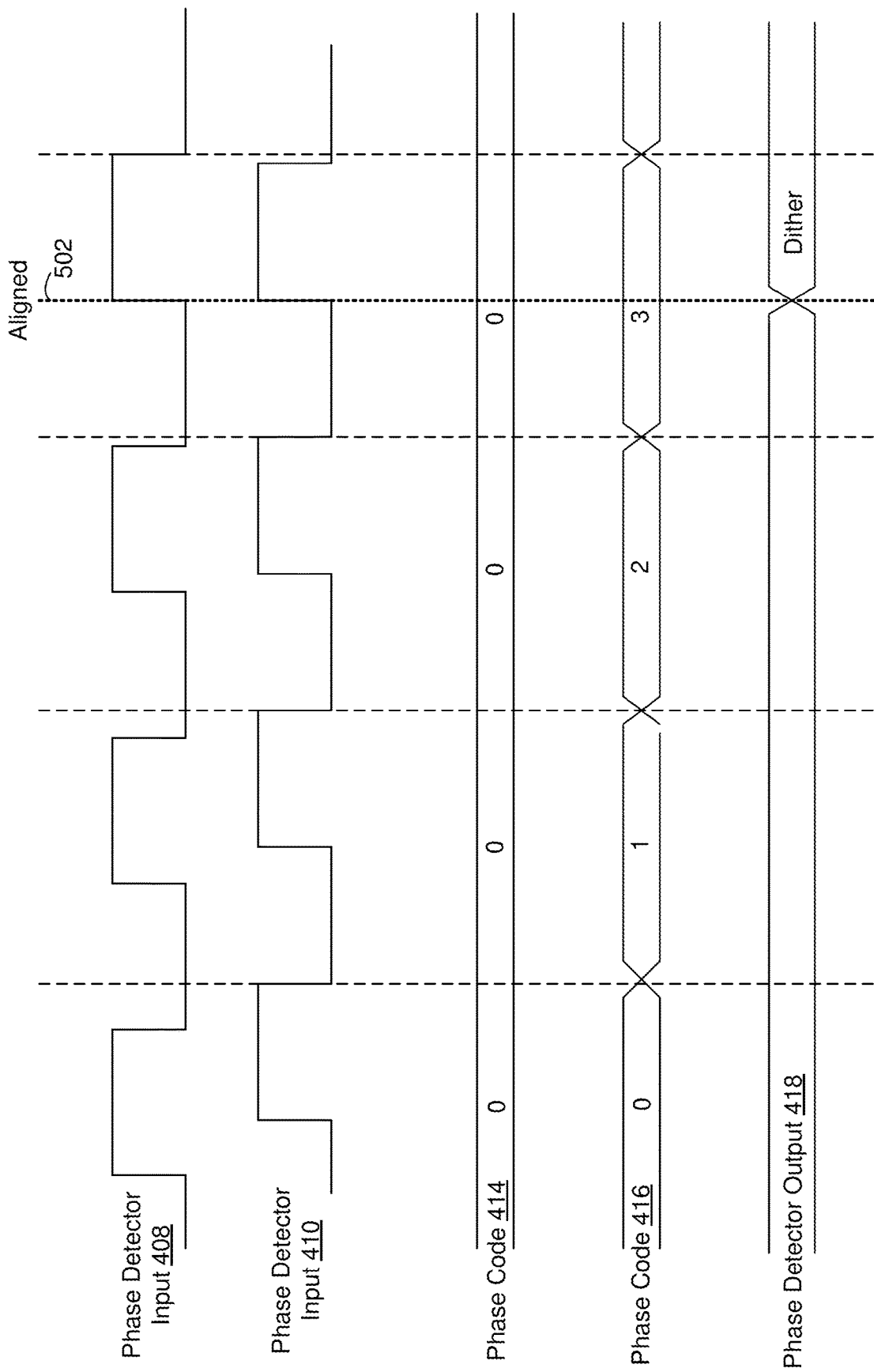
FIG. 5 is a timing diagram illustrating the operation of the phase to digital converter of FIG. 4, according to one embodiment.

FIG. 5 is a timing diagram illustrating the operation of the phase to digital converter of FIG. 4, according to one embodiment. Inputs of phase detector 412 shown in FIG. 5 correspond to the phase-adjusted slow clock 408 and the phase-adjusted delayed slow clock 410, respectively. Phase codes shown in FIG. 5 correspond to the digital phase adjustment signals 414, 416 that cause the phase adjustments by phase mixers 402, 404, respectively. As shown in FIG. 5, digital phase adjustment signal 414 is maintained at digital value zero (0) at each cycle of the phase-adjusted slow clock 408, and thus the phase of phase-adjusted slow clock 408 is not changed by phase mixer 402. On the other hand, digital phase adjustment signal 416 is incremented from digital value zero (0) to digital value three (3) at each cycle of the phase phase-adjusted slow clock 408, and thus the phase of the phase-adjusted delayed slow clock 410 is accelerated little by little at each cycle.

At timing 502 when a digital phase code three (3) was used as the digital phase adjustment signal 416, the phase-adjusted slow clock 408 and the phase-adjusted delayed slow clock 410 are now in phase. Thus, the difference between the two phase codes (three and zero) of digital phase adjustment signals 416, 414 represents the phase difference between slow clock 150 on link 135 and the delayed slow clock 208 before any phase adjustment by phase mixers 402, 404 took place. The exact phase difference can be determined by the difference in phase codes 414, 416 together with the known frequency of the phase-adjusted slow clock 408.

The use of slow clock 150 according to embodiments herein facilitates the use of digital circuits that would otherwise be bandwidth limited, and obviates the need to power up PLLs 106 to generate the PLL clock 148 during periodic drift calibration, thereby saving power and allowing the memory controller 102 to enter power save operation modes. Use of the low frequency in the slow clock 150 obviates the need to turn on complicated components in the I/O circuitry 114, 126 designed to accommodate high frequency clock signals during periodic drift calibration. Furthermore, the low frequency of the slow clock 150 also enables use of digital circuitry in drift detection circuit 136 that has a time drift substantially proportional to change in voltage/temperature, which facilitates the determination of the amount of calibration needed for generating tclk and rclk.

The drift detection circuit 136 may determine drift in the slow clock signal 150 accurately reflecting the actual drift that would be experienced by the PLL clock 148 if it were to be distributed in memory device 104, because drift detection circuit 136 is placed within the same memory device 104 where the actual clock distribution circuit 128 is placed. While the clock drift is determined on memory device 104 for accuracy, the final drift calculation takes place on controller 102, thereby allowing modification or adaptation of the drift tracking logic 140 outside of the memory device 104 via changes made to the controller 102 or software updates therein.

Upon reading this disclosure, those of ordinary skill in the art will appreciate still alternative structural and functional designs for determining drifts in a clock signal provided from a memory controller to a memory device through the disclosed principles of the present disclosure. Thus, while particular embodiments and applications of the present disclosure have been illustrated and described, it is to be understood that the disclosure is not limited to the precise construction and components disclosed herein. Various modifications, changes and variations which will be apparent to those skilled in the art may be made in the arrangement, operation and details of the method and apparatus of the present disclosure herein without departing from the spirit and scope of the disclosure as defined in the appended claims.

What is claimed is:

1. A memory device comprising:
a memory core to store data;
an interface circuit to receive, from a memory controller, a first timing signal having a first frequency, wherein the first timing signal is to be used to time a data transfer operation with the memory core;
a drift detection circuit that mimics a timing delay through a clock distribution circuit in the memory device where the clock distribution circuit uses the first timing signal for the data transfer operation, the drift detection circuit comprising a phase to digital converter to determine a phase delay between a second timing signal that is received from the memory controller and the second timing signal that is delayed by a plurality of different delay elements, and the drift detection circuit to generate a digital code that is indicative of the phase delay; and
a transmitter to output information including the digital code to the memory controller.

2. The memory device of claim 1, wherein the second timing signal is different from the first timing signal.

3. The memory device of claim 2, wherein the first timing signal has a first frequency and the second timing signal has a second frequency that is less than the first frequency.

4. The memory device of claim 1, wherein the second timing signal is not used by the memory device for the data transfer operation between the memory core and the memory controller.

5. The memory device of claim 1, wherein the interface circuit receives the second timing signal from the memory controller during a power down event or a calibration event of the memory device.

6. The memory device of claim 1, wherein subsequent to the transmitter outputting the information to the memory controller, the interface circuit receives the first timing signal with a phase delay that has been adjusted by the memory controller based on the digital code outputted by the transmitter, and wherein the memory controller and the memory device perform the data transfer operation according to the first timing signal with the adjusted phase delay.

7. The memory device of claim 1, wherein each delay element from the plurality of different delay elements delays the second timing signal by a phase amount representative of drift characteristics of a distinct portion of distribution of the first timing signal in the memory device to generate a third timing signal.

8. The memory device of claim 7, wherein the phase to digital converter determines a plurality of instances of phase delay through the clock distribution circuit in a form of digital codes, each instance of phase delay determined based on a difference between the second timing signal and one of a plurality of third timing signals generated by the plurality of different delay elements, the difference indicative of the phase delay caused by the timing delay.

9. The memory device of claim 8, wherein the phase to digital converter comprises:
a first phase mixer that adjusts a phase of the second timing signal by a first phase adjustment amount to generate a fourth timing signal;
a second phase mixer that adjusts a phase of the third timing signal by a second phase adjustment amount to generate a fifth timing signal;
a phase detector that determines whether the fourth timing signal and the fifth timing signal are substantially in phase; and
a control circuit that generates the digital code representative of a difference between the first phase adjustment amount and the second phase adjustment amount when the fourth timing signal and the fifth timing signal are substantially in phase.

10. The memory device of claim 1, wherein the drift detection circuit comprises CMOS digital circuitry.

11. The memory device of claim 9, wherein the drift detection circuit remains on during the data transfer operation between the memory device and the memory controller.

12. A method of operating a memory device including a memory core that stores data, the method comprising:
receiving from a memory controller a first timing signal having a first frequency, wherein the first timing signal is to be used to time a data transfer operation with the memory core;
mimicking a timing delay through a clock distribution circuit in the memory device where the clock distribution circuit uses the first timing signal for the data transfer operation to determine a phase delay between a second timing signal that is received from the memory controller and the second timing signal that is delayed by a plurality of different delay elements;
generating information including a digital code that is indicative of the phase delay occurring on the second timing signal in the memory device; and
outputting the information to the memory controller.

13. The method of claim 12, wherein the second timing signal is different from the first timing signal.

14. The method of claim 13, wherein the first timing signal has a first frequency and the second timing signal has a second frequency that is less than the first frequency.

15. The method of claim 12, wherein the second timing signal is not used by the memory device for the data transfer operation between the memory core and the memory controller.

16. The method of claim 12, wherein the second timing signal is received from the memory controller during a power down event or a calibration event of the memory device.

17. The method of claim 12, further comprising:
receiving the first timing signal with a phase delay that has been adjusted by the memory controller based on the digital code subsequent to outputting the information to the memory controller, and
performing the data transfer operation with the memory controller according to the first timing signal with the adjusted phase delay.

18. The method of claim 12, further comprising:
delaying the second timing signal using the plurality of different delay elements to generate a plurality of third timing signals that each correspond to a corresponding delay element from the plurality of different delay elements, each delay element delaying the second timing signal by a corresponding phase amount representative of drift characteristics of a distinct portion of the clock distribution circuit; and
determining a plurality of instances of phase delay through the clock distribution circuit in a form of digital codes, each instance of phase delay determined based on a difference between the second timing signal and one of the plurality of third timing signals, the difference indicative of the phase delay caused by timing drift.

19. The method of claim 18, wherein determining the plurality of instances of the phase delay comprises:
adjusting a phase of the second timing signal by a first phase adjustment amount to generate a fourth timing signal;
adjusting a phase of one of the plurality of third timing signals by a second phase adjustment amount to generate a fifth timing signal;
determining whether the fourth timing signal and the fifth timing signal are substantially in phase; and
generating a digital code representative of a difference between the first phase adjustment amount and the second phase adjustment amount when the fourth timing signal and the fifth timing signal are in phase.

20. A memory device comprising:
a means for storing data;
a means for receiving, from a memory controller, a first timing signal having a first frequency, wherein the first timing signal is to be used to time a data transfer operation with the means for storing data;
a means for mimicking a timing delay through a clock distribution circuit in the memory device where the clock distribution circuit uses the first timing signal for the data transfer operation, the means for mimicking the timing delay comprising a means for determining a phase delay between a second timing signal that is received from the memory controller and the second timing signal that is delayed, and the means for mimicking the timing delay generating a digital code that is indicative of the phase delay; and
a means for outputting information including the digital code to the memory controller.

* * * * *